United States Patent
Wang et al.

(10) Patent No.: US 7,427,569 B2
(45) Date of Patent: Sep. 23, 2008

(54) METAL ETCHING PROCESS AND REWORK METHOD THEREOF

(75) Inventors: Tza-Hao Wang, Taoyuan County (TW);
Jin-Yang Huang, Taipei County (TW);
Hung-Kwei Liao, Taoyuan (TW);
Ming-Sheng Tung, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 205 days.

(21) Appl. No.: 11/307,801

(22) Filed: Feb. 23, 2006

(65) Prior Publication Data

US 2007/0166979 A1 Jul. 19, 2007

(30) Foreign Application Priority Data

Jan. 4, 2006 (TW) .............................. 95100310 A

(51) Int. Cl.
*H01L 21/00* (2006.01)
*H01L 21/302* (2006.01)
*H01L 21/461* (2006.01)

(52) U.S. Cl. .................. 438/717; 438/736; 438/742; 438/735; 438/754; 257/E21.459; 257/E21.44

(58) Field of Classification Search ............... 438/597, 438/16, 696, 717, 720, 725, 736, 737, 742, 438/754; 257/E21.159, 21.528
See application file for complete search history.

(56) References Cited

U.S. PATENT DOCUMENTS

| | | | | |
|---|---|---|---|---|
| 4,451,326 A | * | 5/1984 | Gwozdz | 438/624 |
| 4,689,113 A | * | 8/1987 | Balasubramanyam et al. | 438/631 |
| 4,778,739 A | * | 10/1988 | Protschka | 430/30 |
| 6,071,824 A | * | 6/2000 | Singh et al. | 438/717 |
| 6,117,345 A | * | 9/2000 | Liu et al. | 216/19 |
| 6,358,830 B1 | * | 3/2002 | Morozumi | 438/597 |
| 6,395,644 B1 | * | 5/2002 | Hopper et al. | 438/738 |
| 6,455,431 B1 | * | 9/2002 | Hsieh et al. | 438/691 |

OTHER PUBLICATIONS

Article titled "Segregation of Cu to Grain Boundaries by Aging Treatment and its Effect on EM Resistance for AlCu/TiN Lines" jointly by authored by Takenao Nemoto et ul., LSI Research Center, Kawasaki Steel Corp., copyright 1994 IEEE/IRPS. pp. 207-212.

* cited by examiner

*Primary Examiner*—Michael S Lebentritt
(74) *Attorney, Agent, or Firm*—Jianq Chyun IP Office

(57) ABSTRACT

A metal etching process is described. A substrate having a dielectric layer thereon is provided. An aluminum-copper alloy layer is formed on the dielectric layer. A hard mask layer is formed on the aluminum-copper alloy layer. A patterned photoresist layer is formed on the hard mask layer and then the hard mask layer is patterned. A thermal treatment process is performed. The thermal treatment process is carried out at a temperature of more than 300° C. for a period of at least 3 minutes. Thereafter, the aluminum-copper alloy layer is etched using the patterned hard mask layer as an etching mask. Due to the thermal treatment, the metal precipitate ($CuAl_2$) within the aluminum-copper alloy layer is eliminated and hence the metal etching process is improved.

16 Claims, 6 Drawing Sheets

METAL ETCHING PROCESS AND REWORK METHOD THEREOF

CROSS-REFERENCE TO RELATED APPLICATION

This application claims the priority benefit of Taiwan application serial no. 95100310, filed on Jan. 4, 2006. All disclosure of the Taiwan application is incorporated herein by reference.

BACKGROUND OF THE INVENTION

1. Field of the Invention

The present invention relates to an etching process. More particularly, the present invention relates to a metal etching process and rework method thereof.

2. Description of Related Art

At present, there are two major etching techniques that are commonly used in the fabrication of semiconductor device, the wet etching process and the dry etching process. Wet etching process relies on chemical reaction to etch the film layers. On the other hand, dry etching process relies on physical action to etch the film layers.

In general, a photoresist layer is formed over the need-to-be-etched layer prior to performing either a wet etching or a dry etching operation. Then, a photolithographic process is carried out to imprint the required pattern to the photoresist layer. Thereafter, the need-to-be-etched layer is etched using the photoresist layer as an etching mask. After that, the photoresist layer is removed. The most commonly used method for removing the photoresist layer includes using a plasma etching process. However, in the metal etching process for etching aluminum-copper alloy layers, the plasma process of removing the photoresist layer often produces a number of problems.

FIGS. 1A through 1C are schematic cross-sectional views showing the steps in a conventional metal etching process. First, as shown in FIG. 1A, a dielectric layer 102, a barrier layer 104, an aluminum-copper alloy layer 106, a protective layer 108, a hard mask 110 and a patterned photoresist layer 112 are sequentially formed over a substrate 100.

Next, as shown in FIG. 1B, an etching operation is carried out using the patterned photoresist layer 112 as an etching mask so that the pattern on the patterned photoresist layer 112 is transferred to the hard mask layer 110a. Thereafter, plasma is used to remove the patterned photoresist layer 112. However, using plasma to remove the patterned photoresist layer 112 requires a temperature around 180° C. At this temperature, the aluminum-copper alloy layer 106 will produce some metal precipitate ($CuAl_2$) near the junction between the bottom of the alloy layer 106 and the barrier layer 104 and the metal precipitate will gradually migrate toward the barrier layer 104.

As shown in FIG. 1C, using the patterned hard mask layer 110a as a mask, the aluminum-copper alloy layer 106 is etched. Due to the effect of the metal precipitate 107 in the barrier layer 104, an incomplete removal (indicated as area 10) of the barrier layer 104 occurs. Thus, the phenomenon of conduction in the metallic layer of the semiconductor device will occur leading to a short circuit. Furthermore, due to the presence of the metal precipitate 107, the gaseous etchant will move toward the sidewalls of the aluminum-copper alloy layer 106 in the process of patterning the aluminum-copper alloy layer 106 leading to over-etching problem.

The foregoing problems can be largely resolved by lowering the temperature for removing the patterned photoresist layer and increasing the time for etching the aluminum-copper alloy layer. Yet, lowering the temperature for removing the patterned photoresist layer frequently lead to an incomplete removal of the photoresist material and needs a longer removing period. The longer removing period also increases the production of metal precipitate and escalates the aforementioned metal short circuit problem. On the other hand, increasing the etching time for the aluminum-copper alloy layer may damage the hard mask layer leading to the exposure of the aluminum-copper alloy layer.

SUMMARY OF THE INVENTION

Accordingly, at least one objective of the present invention is to provide a metal etching process capable of reducing or eliminating the metal precipitate inside an aluminum-copper alloy layer.

At least another objective of the present invention is to provide a metal etching process capable of preventing the sidewalls of an aluminum-copper alloy layer from damage and the accumulation of metal precipitate inside the aluminum-copper alloy layer during a patterning process.

To achieve these and other advantages and in accordance with the purpose of the invention, as embodied and broadly described herein, the invention provides a metal etching process. First, a substrate having a dielectric layer thereon is provided. Then, an aluminum-copper alloy layer is formed on the dielectric layer. Thereafter, a hard mask layer is formed on the aluminum-copper alloy layer. After that, a patterned photoresist layer is formed on the hard mask layer and then the hard mask layer is patterned. The patterned photoresist layer is removed. Next, a thermal treatment process is performed. The thermal treatment process is carried out at a temperature of more than 300° C. for a period of at least 3 minutes. Then, using the patterned hard mask layer as an etching mask, the aluminum-copper alloy layer is etched.

The present invention also provides a rework method for a metal etching process. First, a substrate having a dielectric layer thereon is provided. Next, an aluminum-copper alloy layer is formed on the dielectric layer. Thereafter, a hard mask layer is formed on the aluminum-copper alloy layer. After forming a first patterned photoresist layer over the hard mask layer, the work piece is checked to determine if a rework process needs to be carried out. The decision for the rework process generally includes inspecting the precision of the patterned photoresist layer. If the rework process is required, it shall be performed, wherein the rework process includes removing the first patterned photoresist layer and forming a second patterned photoresist layer over the hard mask layer. The process of determining whether or not a rework is required and the rework process itself can be repeated until the precision of the patterned photoresist layer achieves a minimum specification. After that, the hard mask layer is patterned. The patterned photoresist layer over the hard mask layer is removed. Next, a thermal treatment process is performed. The thermal treatment process is carried out at a temperature of more than 300° C. for a period of at least 3 minutes. Then, using the patterned hard mask layer as an etching mask, the aluminum-copper alloy layer is etched.

In the present invention, a thermal treatment process is performed at a temperature of more than 300° C. for at least 3 minutes after removing the patterned photoresist layer. Hence, all the metal precipitate in the aluminum-copper alloy layer produced in the process of removing the patterned photoresist layer with plasma is dissolved. The etching process is carried out only after all the metal precipitate in the aluminum-copper alloy layer is dissolved. Thus, an incomplete removal of the aluminum-copper alloy layer or other underlying material layers due to the presence of metal precipitate is largely avoided. Consequently, internal short circuit of the device and damages to the sidewalls of the aluminum-copper alloy layer are also prevented.

In addition, the absence of metal precipitate in the etching process also prevents an increase in the time needed to etch the aluminum-copper alloy layer and lowers the risk of damaging the hard mask layer and exposing the aluminum-copper alloy layer. Moreover, there is no need to set a limit to the number of rework process that may easily induce the accumulation of the metal precipitate. Therefore, the number of rework can be increased to achieve a higher level of precision for the photolithographic process. Furthermore, there is no need to lower the temperature for removing the patterned photoresist layer just to avoid the production of the metal precipitate and sustain an incomplete removal of the patterned photoresist layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
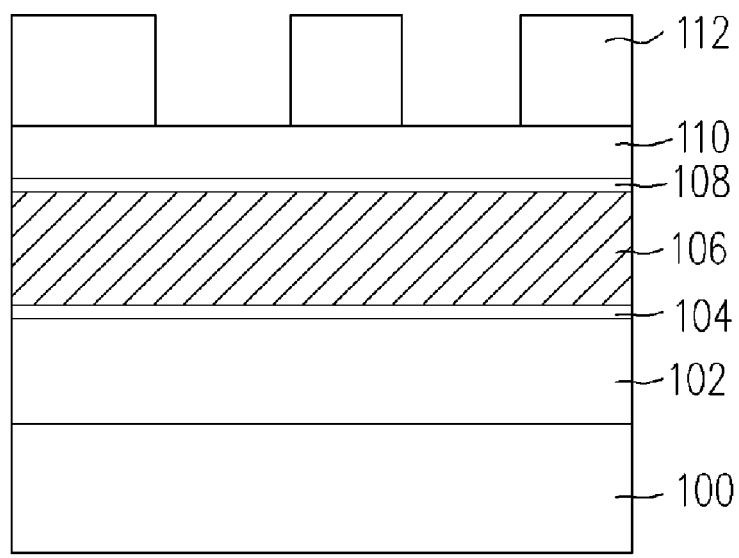
FIGS. 1A through 1C are schematic cross-sectional views showing the steps in a conventional metal etching process.
Figure 1B:
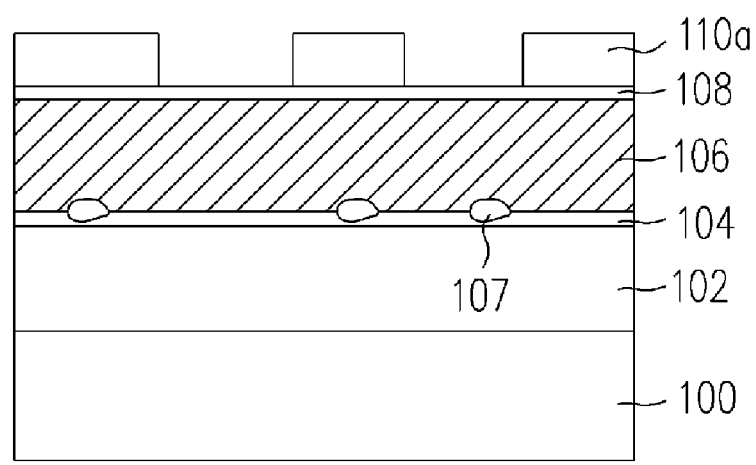

Reference will now be made in detail to the present preferred embodiments of the invention, examples of which are illustrated in the accompanying drawings. Wherever possible, the same reference numbers are used in the drawings and the description to refer to the same or like parts.

Figure 2A:
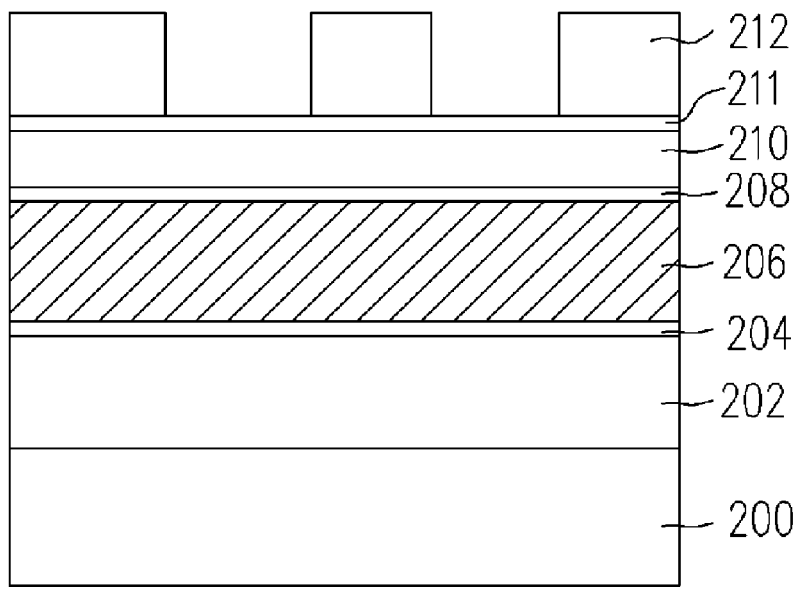
FIGS. 2A through 2D are schematic cross-sectional views showing the steps in a metal etching process according to one embodiment of the present invention.

FIGS. 2A through 2D are schematic cross-sectional views showing the steps in a metal etching process according to one embodiment of the present invention. First, as shown in FIG. 2A, a substrate 200 is provided. The substrate 200 has a dielectric layer 202 formed thereon. The dielectric layer 202 comprises a silicon oxide layer formed, for example, by performing a chemical vapor deposition process. Then, an aluminum-copper alloy layer 206 is formed over the dielectric layer 202. The aluminum-copper alloy layer 206 is formed, for example, by performing a physical vapor deposition process. The percentage of copper in the aluminum-copper alloy layer 206 is about 0.5%. After a subsequent patterning operation, the aluminum-copper alloy layer 206 mainly serves as an interconnection line for the semiconductor devices. Furthermore, before forming the aluminum-copper alloy 206, a barrier layer 204 may also be formed over the dielectric layer 202. The barrier layer 204 can be a titanium layer or a titanium nitride layer, or a titanium and titanium nitride composite layer. The method of forming the barrier layer 204 includes performing a chemical vapor deposition process, for example. The barrier layer 204 is used to increase the adhesion of the aluminum-copper alloy layer 206 and prevent the atoms in the aluminum-copper alloy layer 206 from diffusing into the bottom dielectric layer 202.

Again, as shown in FIG. 2A, a hard mask layer 210 is formed over the aluminum-copper alloy layer 206. The hard mask layer 210 comprises a silicon oxynitride layer, a silicon nitride layer or a silicon oxide layer formed, for example, by performing a chemical vapor deposition process. Similarly, after forming the aluminum-copper alloy layer 206 but before forming the hard mask layer 210, a protective layer 208 may also form over the aluminum-copper alloy layer 206. The protective layer 208 can be a titanium layer or a titanium nitride layer, or a titanium and titanium nitride composite layer formed, for example, by performing a chemical vapor deposition process. The protective layer 208 is used to increase the adhesion between the aluminum-copper alloy layer 206 and a subsequently formed film layer. In addition, the protective layer 208 also provides protection in a subsequent hard mask layer 210 etching operation and prevents the surface of the aluminum-copper alloy layer 206 from producing hillock protrusions. After that, a patterned photoresist layer 212 is formed over the hard mask layer 210. In general, after the step of forming the hard mask layer 210 but before the step of forming the patterned photoresist layer 212, an anti-reflection layer 211 may also formed over the hard mask layer 210. The anti-reflection layer can be a titanium nitride layer, a titanium-tungsten alloy layer, an amorphous silicon layer or a viscous organic liquid compound layer, for example. The step of forming the titanium nitride, the titanium-tungsten alloy or the amorphous silicon layer includes performing a chemical vapor deposition process and the step of forming the viscous organic liquid compound includes performing a spin-coating process. The anti-reflection layer 211 can prevent the reflection of light from the surface of the aluminum-copper alloy layer 206 so that the precision of the patterned photoresist layer 212 is increased.

Figure 2B:
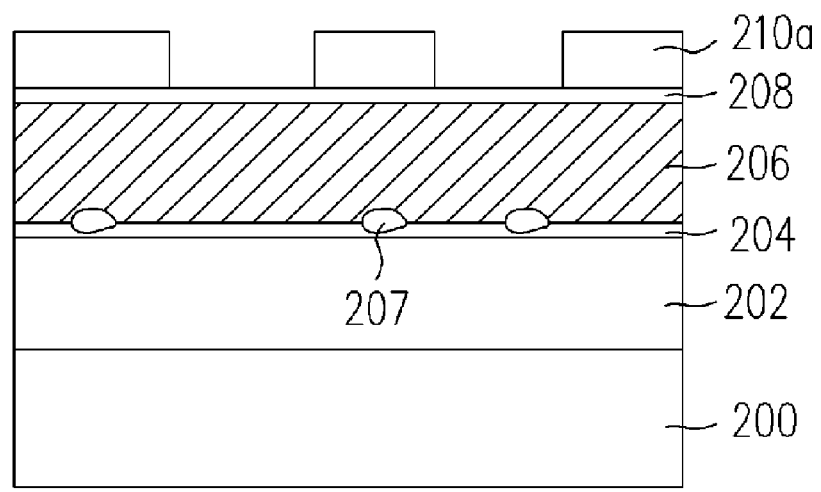
Figure 3:
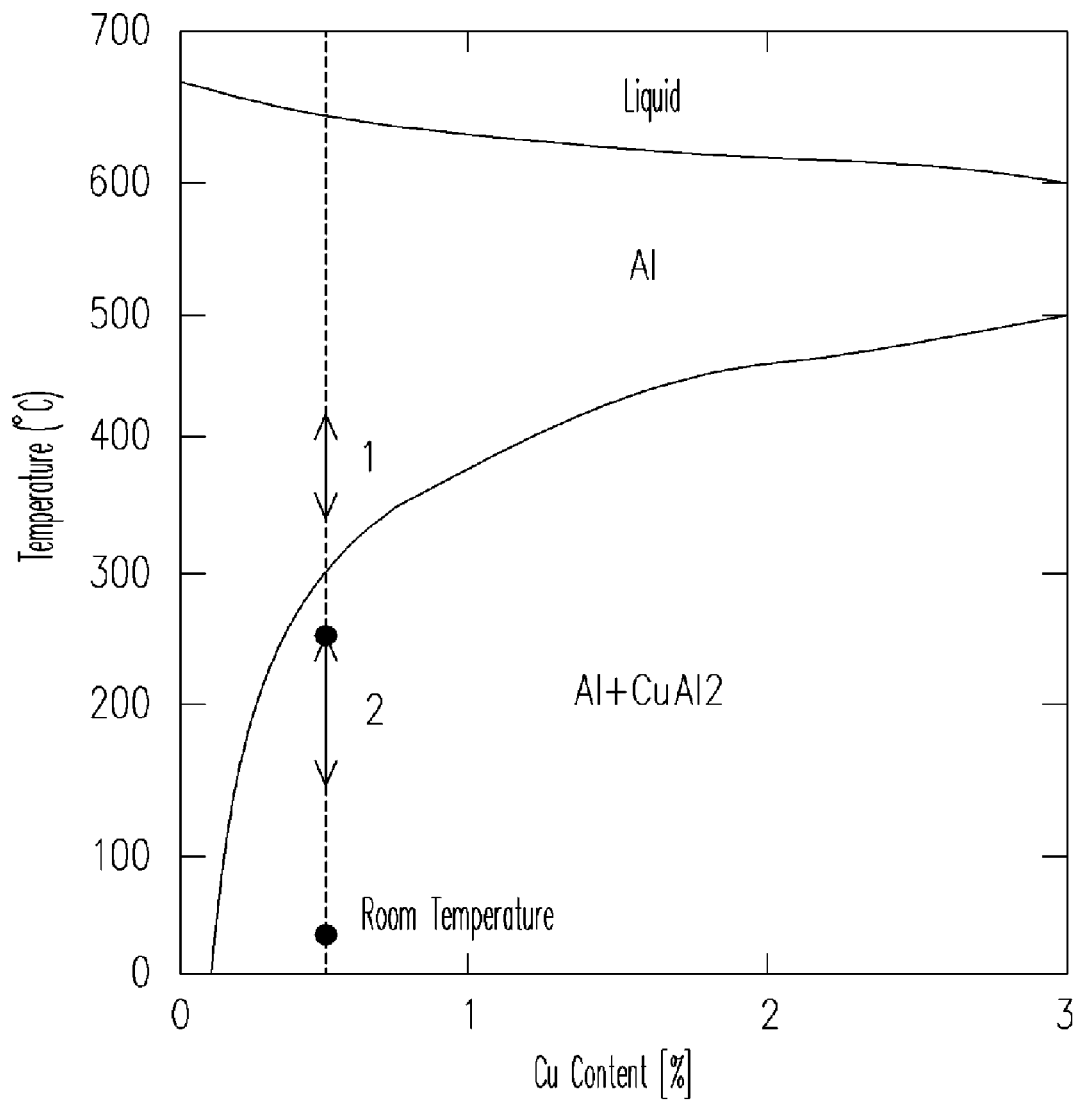
FIG. 3 is a graph showing the phase change in an aluminum-copper alloy layer at different constituent ratios versus the temperature.
Figure 4A:
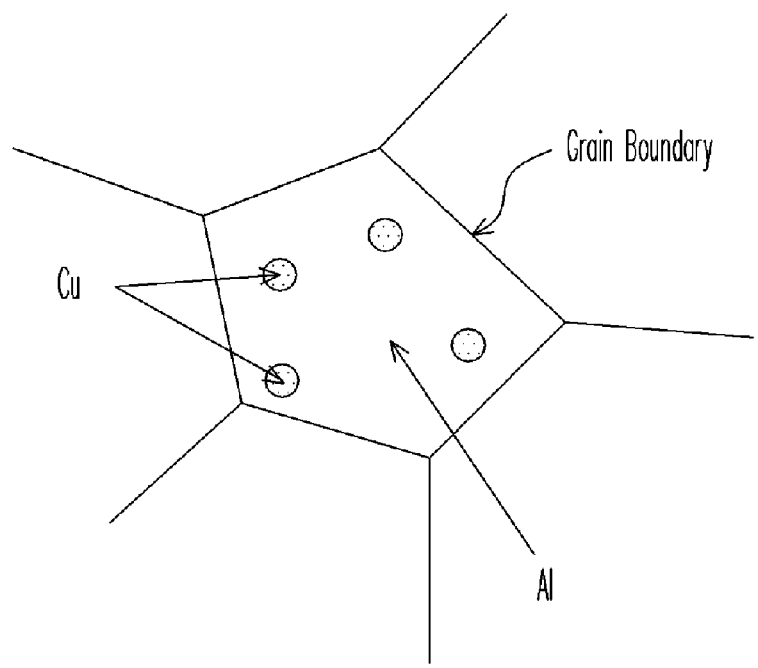
FIG. 4A is a diagram showing the crystal lattice of an aluminum-copper alloy layer before removing the photoresist or after performing the thermal treatment.
Figure 4B:
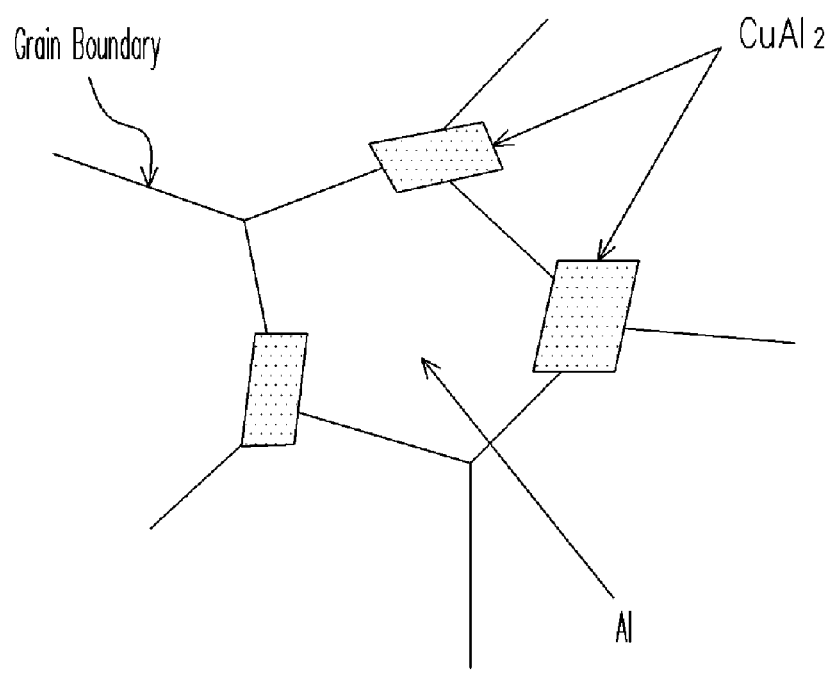
FIG. 4B is a diagram showing the crystal lattice of an aluminum-copper alloy layer after removing the photoresist but before performing the thermal treatment.

As shown in FIG. 2B, using the patterned photoresist layer 212 as a mask, an etching process is performed to pattern the hard mask layer 210 into a patterned hard mask layer 210a. It should be noted that, according to the aluminum-copper phase diagram in FIG. 3 with the horizontal axis showing the copper content and the vertical axis indicating the temperature, $CuAl_2$ metal precipitate 207 will form at the interface between the aluminum-copper alloy layer 206 and the barrier layer 204 after performing the process for removing the patterned photoresist layer 212. At this stage, the aluminum-copper alloy layer 206 has a crystal lattice structure as shown in FIG. 4B. The reason for having this type of crystal structure is because plasma is used to remove the patterned photoresist layer 212. The process of removing the patterned photoresist material with plasma generally demands an environmental temperature of around 180° C. and a processing period of at least 120 second. At this temperature, the phase of the aluminum-copper is located somewhere in the line indicated by the double-sided arrow 2. Hence, $CuAl_2$ metal precipitate 207 is easily produced.

Figure 2C:
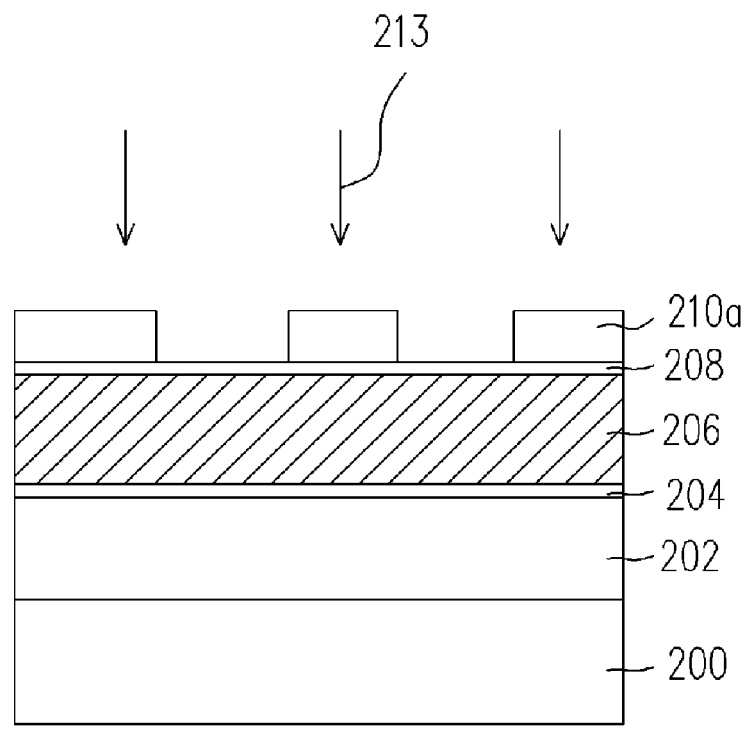

As shown in FIG. 2C, after removing the patterned photoresist layer 212, a thermal treatment process is performed by raising the temperature to 400° C. for a period of at least 3 minutes. All $CuAl_2$ metal precipitate 207 will dissolve at a temperature of about 400° C. At this temperature, the phase of the aluminum-copper is located somewhere in the line indicated by the double-sided arrow 1. Hence, the thermal treatment will wipe out all trace of metal precipitate from the junction between the aluminum-copper alloy layer 206 and the barrier layer 204. Consequently, the aluminum-copper alloy layer 206 will have a crystal lattice structure as shown in FIG. 4A.

Figure 1C:
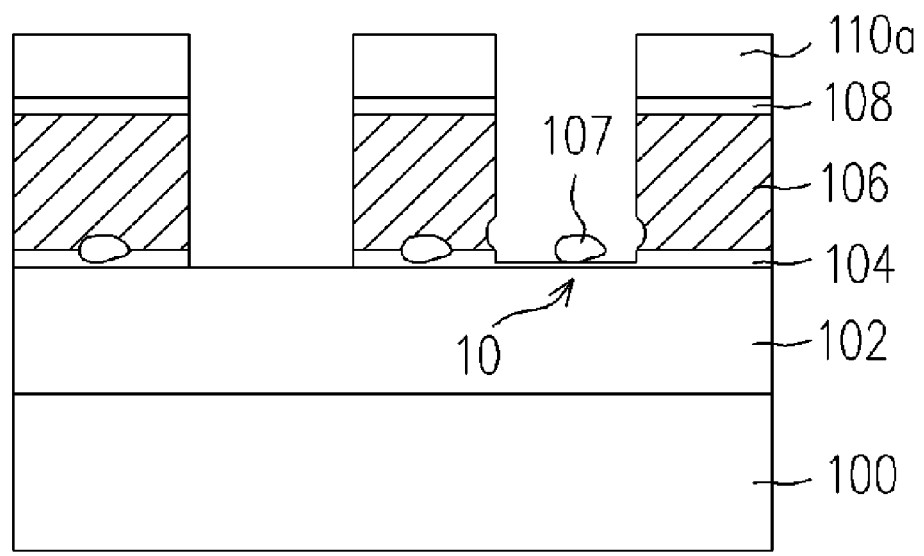
Figure 2D:
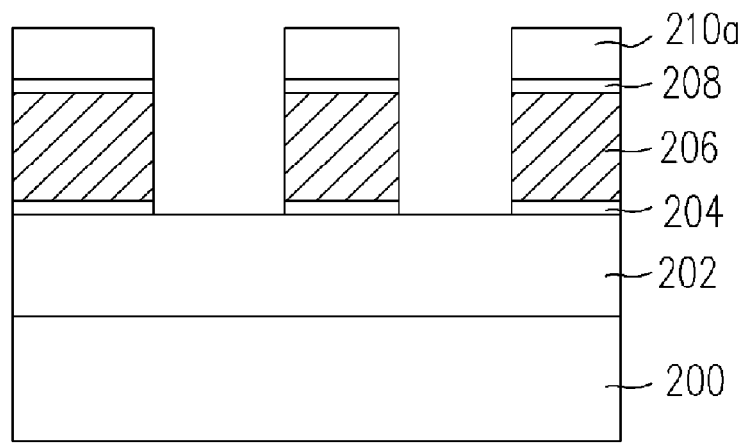

As shown in FIG. 2D, using the patterned hard mask layer 210a as an etching mask, the aluminum-copper alloy layer 206 is patterned to serve as an interconnecting line in a subsequent process. Thereafter, subsequent process for fabricating a semiconductor device may be carried out whose details are omitted here. It should be noted that the metal precipitate 204 is completely removed after the thermal treatment. Therefore, the barrier layer 204 is completely removed in an etching operation. In other words, incomplete etching (for example, in region 10 of FIG. 1C) or damage to the sidewalls of the aluminum-copper alloy layer 206 will not occur. Moreover, there is no need to extend the etching time of the copper-aluminum alloy layer 206 to remove the barrier layer 204 completely and hence expose the aluminum-copper alloy layer 206 through a damaged hard mask layer 210a.

It should be noted that when the precision of the patterned photoresist layer 212 as shown in FIG. 2A is low, in other words, the errors in the photoresist layer after development is too large, a rework of the patterned photoresist layer 212 is often carried out. After removing the original patterned photoresist layer 212, a new patterned photoresist layer 212 is formed. The rework can be continued until the resulting patterned photoresist layer has a precision surpassing a specification. However, as the number of rework increases, the number of plasma operation for removing the patterned photoresist layer 212 also increases so that the amount of metal precipitate accumulated inside the aluminum-copper alloy layer 206 also increases. As a result, the effect of the metal precipitate on subsequent process will be increasingly important. Therefore, in another embodiment, a thermal treatment 213 of raising the temperature to 400° C. and maintaining at that temperature for at least 3 minutes as described in FIG. 2C is performed after a rework process for removing the metal precipitate 207. After that, the etching process described in FIG. 2D and other subsequent processes are performed. Therefore the performance of the etching process is enhanced.

In summary, a thermal treatment process is performed at a temperature of more than 300° C. for at least 3 minutes after removing the patterned photoresist layer. Hence, all the metal precipitate in the aluminum-copper alloy layer produced in the process of removing the patterned photoresist layer with plasma is dissolved. Since the etching process is carried out only after all the metal precipitate in the aluminum-copper alloy layer is removed, an incomplete removal of the aluminum-copper alloy layer or other underlying material layers due to the presence of metal precipitate can be substantially avoided. Consequently, internal short circuit of the device and damages to the sidewalls of the aluminum-copper alloy layer are also prevented.

In addition, there is no need to set a limit to the number of rework process that would be carried out to induce the accumulation of the metal precipitate. Therefore, the number of rework can be increased to achieve a higher level of precision for the photolithographic process. Furthermore, there is no need to lower the temperature for removing the patterned photoresist layer to avoid the production of the metal precipitate so that the patterned photoresist layer can be completely removed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal etching process, comprising the steps of:
providing a substrate, having a dielectric layer formed thereon;
forming an aluminum-copper alloy layer over the dielectric layer;
forming a hard mask layer on the aluminum-copper alloy layer;
forming a patterned photoresist layer on the hard mask layer;
patterning the hard mask layer;
removing the patterned photoresist layer;
performing a thermal treatment at a temperature greater than 300° C. for a period of at least 3 minutes; and
etching the aluminum-copper alloy layer using the patterned hard mask layer as an etching mask.

2. The metal etching process of claim 1, further comprising a step of forming a barrier layer over the dielectric layer before the step of forming the aluminum-copper alloy layer.

3. The metal etching process of claim 2, wherein the barrier layer comprises a titanium layer, a titanium nitride layer or a composite layer comprising a titanium layer and a titanium nitride layer.

4. The metal etching process of claim 1, further comprising a step of forming a protective layer over the aluminum-copper alloy layer after the step of forming the aluminum-copper alloy layer but before the step of forming the hard mask layer.

5. The metal etching process of claim 4, wherein the protective layer comprises a titanium layer, a titanium nitride layer or a composite layer comprising a titanium layer and a titanium nitride layer.

6. The metal etching process of claim 1, further comprising a step of forming an anti-reflection layer over the hard mask layer after the step of forming the hard mask layer but before the step of forming the patterned photoresist layer.

7. The metal etching process of claim 6, wherein the anti-reflection layer comprises titanium nitride, titanium-tungsten alloy, amorphous silicon or viscous organic liquid compound.

8. The metal etching process of claim 1, wherein the hard mask layer includes silicon oxynitride, silicon nitride or silicon oxide.

9. The metal etching process of claim 1, wherein the dielectric layer includes silicon oxide.

10. A rework method in a metal etching process, comprising the steps of:
providing a substrate, wherein the substrate has a dielectric layer formed thereon;
forming an aluminum-copper alloy layer on the dielectric layer;
forming a hard mask layer on the aluminum-copper alloy layer;
forming a first patterned photoresist layer on the hard mask layer;
inspecting the first patterned photoresist layer to determine whether or not a rework process is required;
if the rework process is required, performing the rework process which including the steps of:
removing the first patterned photoresist layer; and
forming a second patterned photoresist layer over the hard mask layer;

patterning the hard mask layer;

removing the patterned photoresist layer above the hard mask layer;

performing a thermal treatment at a temperature greater than 300° C. for a period of at least 3 minutes; and etching the aluminum-copper alloy layer using the patterned hard mask layer as an etching mask.

11. The rework method of claim 10, further comprising a step of forming a barrier layer over the dielectric layer before the step of forming the aluminum-copper alloy layer.

12. The rework method of claim 11, wherein the barrier layer includes a titanium layer, a titanium nitride layer or a composite layer comprising a titanium layer and a titanium nitride layer.

13. The rework method of claim 10, further comprising a step of forming a protective layer over the aluminum-copper alloy layer after forming the aluminum-copper alloy layer and before forming the hard mask layer.

14. The rework method of claim 13, wherein the protective layer includes a titanium layer, a titanium nitride layer or a composite layer comprising a titanium layer and a titanium nitride layer.

15. The rework method of claim 10, wherein the hard mask layer includes silicon oxynitride layer, silicon nitride layer or silicon oxide layer.

16. The rework method of claim 10, wherein the dielectric layer includes silicon oxide layer.

* * * * *